United States Patent [19]

Rijckaert et al.

[11] Patent Number: 5,619,171
[45] Date of Patent: Apr. 8, 1997

[54] PHASE-LOCKED LOOP, PHASE COMPARATOR FOR USE IN THE PHASE-LOCKED LOOP, AND REPRODUCING DEVICE INCLUDING THE PHASE-LOCKED LOOP

[75] Inventors: Albert M. A. Rijckaert; Johannes J. L. M. Van Vlerken, both of Eindhoven, Netherlands

[73] Assignee: U.S. Philips Corporation, New York, N.Y.

[21] Appl. No.: 534,092

[22] Filed: Sep. 26, 1995

[30] Foreign Application Priority Data

Sep. 28, 1994 [EP] European Pat. Off. .............. 94202806

[51] Int. Cl.$^6$ ........................... H03D 13/00; H03L 7/085
[52] U.S. Cl. ................. 331/1 A; 331/17; 331/27; 327/12
[58] Field of Search .................. 331/17, 25, 27, 331/1 A; 327/12

[56] References Cited

U.S. PATENT DOCUMENTS

| | | | |
|---|---|---|---|
| 4,371,974 | 2/1983 | Dugan | 375/82 |
| 4,422,176 | 12/1983 | Summers | 331/1 A |
| 4,535,459 | 8/1985 | Hogge, Jr. | 375/324 |
| 5,432,480 | 7/1995 | Popescu | 331/27 |

FOREIGN PATENT DOCUMENTS 0402711  12/1990  European Pat. Off. .

Primary Examiner—Siegfried H. Grimm
Attorney, Agent, or Firm—Edward Goodman

[57] ABSTRACT

A phase-locked loop includes an input terminal (1) for receiving a binary signal, a phase comparator (3) having a first input (2) coupled to the input terminal (1), having a second input (4), and having an output (5) coupled to an input (9) of a control-signal-controlled oscillator (10) via a control-signal generator unit (7). An output (11) of the oscillator is coupled to the second input of the phase comparator. The phase comparator derives a first pulse ($P_1$) and a second pulse ($P_2$) in response to a signal transition from a first value to a second value in the binary signal applied to the first input and an oscillation signal applied to the second input, the first pulse having a pulse width which is a measure of the phase difference between the binary signal and the oscillation signal, and the second pulse having a pulse width proportional to $½·f_o$, where $f_o$ is the frequency of the oscillation signal. The control-signal generator unit (7) derives a control signal from the first pulse and the second pulse and applies the control signal to the oscillator, and the control-signal generator unit derives such a control signal from the first pulse and the second pulse that the phase difference is controlled substantially toward zero.

24 Claims, 7 Drawing Sheets

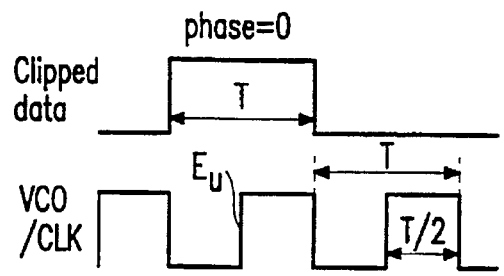
FIG. 3a
FIG. 3b
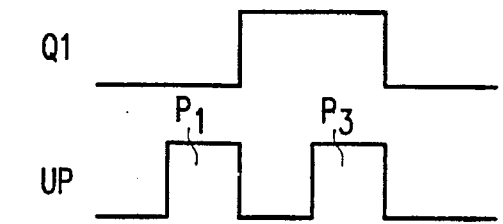
FIG. 3c
FIG. 3d
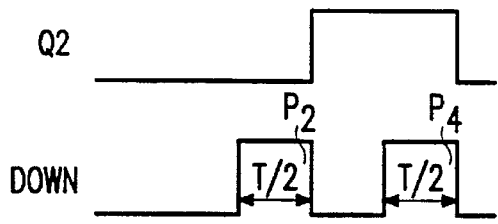
FIG. 3e
FIG. 3f
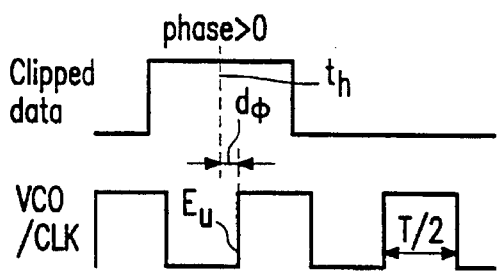
FIG. 4a
FIG. 4b
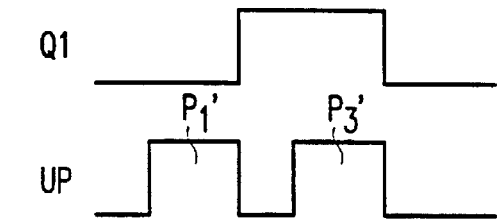
FIG. 4c
FIG. 4d
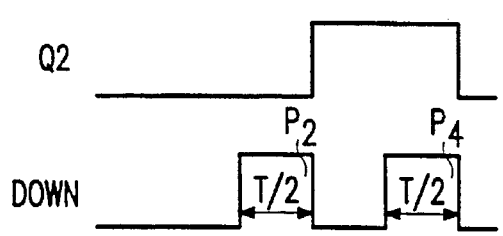
FIG. 4e
FIG. 4f

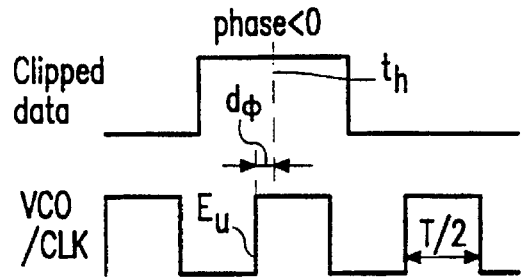
FIG. 5a
FIG. 5b
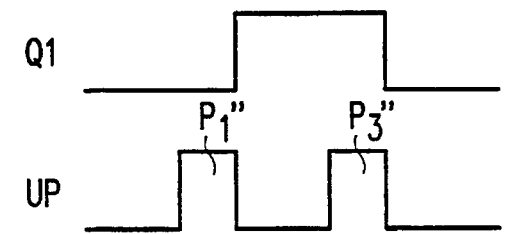
FIG. 5c
FIG. 5d
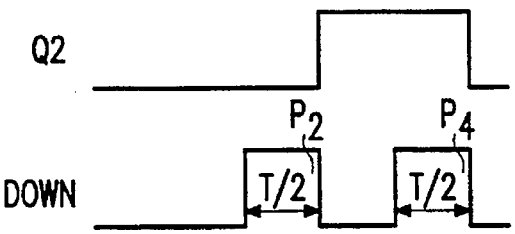
FIG. 5e
FIG. 5f
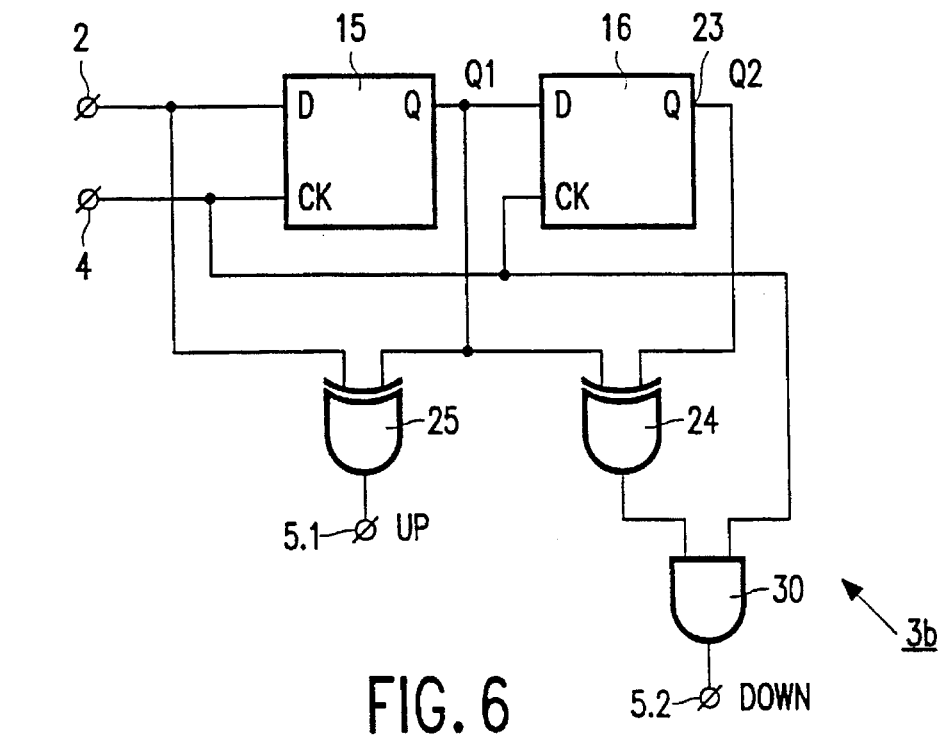
FIG. 6

PHASE-LOCKED LOOP, PHASE COMPARATOR FOR USE IN THE PHASE-LOCKED LOOP, AND REPRODUCING DEVICE INCLUDING THE PHASE-LOCKED LOOP

BACKGROUND OF THE INVENTION

1. Field of the Invention

The invention relates to a phase-locked loop comprising an input terminal for receiving a binary signal, a phase comparator having a first input coupled to the input terminal, having a second input, and having an output, a control-signal-controlled oscillator having an input for receiving a control signal, which input is coupled to the output of the phase comparator, and an output for supplying an oscillation signal of a given frequency in response to the control signal, which output is coupled to the second input of the phase comparator. The invention also relates to a phase comparator for use in the phase-locked loop and to a reproducing device including the phase-locked loop.

2. Description of the Related Art

A phase-locked loop of the type defined in the opening paragraph is generally known and is used to derive a clock signal from the binary signal. The binary signal may be an originally digital signal recorded on a record carrier. Upon reproduction an analog reproduction signal is obtained which is converted into a binary signal in a comparator circuit, this binary signal being then applied to the phase-locked loop. The clock signal can subsequently be used to recover the original digital signal during reproduction.

The known phase-locked loop has the drawback that variations in the nominal oscillator frequency of the oscillator give rise to timing errors in the clock signal.

SUMMARY OF THE INVENTION

It is an object of the invention to provide a phase-locked loop which is less susceptible to timing errors. To this end the phase-locked loop in accordance with the invention is characterized in that the phase comparator is adapted to derive a first pulse and a second pulse in response to a signal transition from a first value to a second value in the binary signal applied to the first input and the oscillation signal applied to the second input, the first pulse being a pulse width which is a measure of the phase difference between the binary signal and the oscillation signal, and the second pulse having a pulse width proportional to $\frac{1}{2}.f_o$, where $f_o$ is said frequency of the oscillation signal, in that the phase-locked loop has a control-signal generator unit coupled to a phase comparator, for deriving a control signal from the first pulse and the second pulse and for applying the control signal to an output, the output being coupled to the input of the oscillator, and in that the control-signal generator unit is adapted to derive such a control signal from the first pulse and the second pulse that the phase difference is controlled substantially toward zero.

The invention is based on the recognition of the fact that a first pulse is obtained which is a measure of the phase difference, whereas the second pulse may be regarded as a reference pulse. However, this reference pulse is not constant but varies with the variations in the clock frequency of the oscillator.

BRIEF DESCRIPTION OF THE DRAWINGS

Embodiments of the invention will now be described in more detail, by way of example, with reference to the drawings. In the drawings:

FIGS. 3a–3f, 4a–4f and 5a–5f show signal patterns which occur in the arrangement of FIG. 2 for zero phase difference, a positive phase difference and a negative phase difference, respectively, between the binary signal and the clock signal;

FIG. 6 shows a second embodiment of the phase comparator;

DESCRIPTION OF THE PREFERRED EMBODIMENTS

Figure 1:
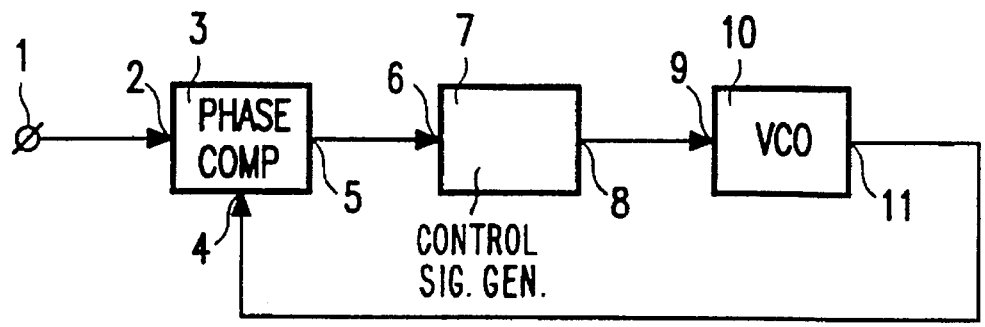
FIG. 1 shows a first embodiment of the phase-locked loop.

FIG. 1 shows a phase-locked loop to which a binary signal can be applied via an input terminal 1. The terminal 1 is coupled to a first input 2 of a phase comparator 3, which has an output 5 coupled to an input 6 of a control-signal generator unit 7. The output 8 of the unit 7 is coupled to an input 9 of a control-signal-controlled oscillator 10, for example, a voltage-controlled oscillator. The output 11 of the oscillator 10 is coupled to a second input 4 of the phase comparator.

Figure 2:
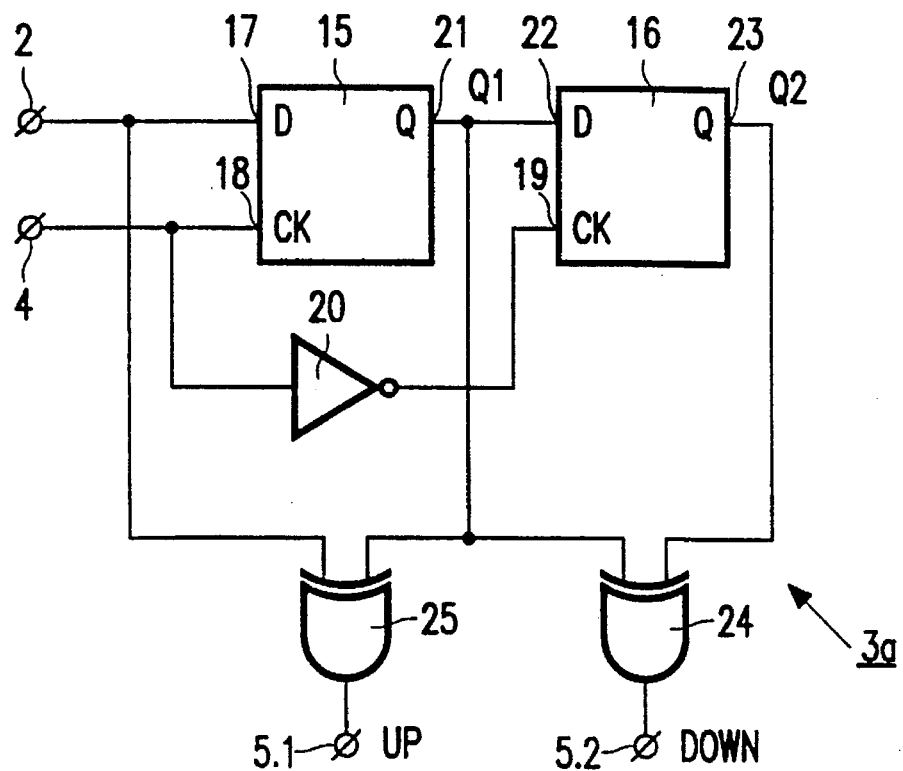
FIG. 2 shows the phase comparator in the loop of FIG. 1 in greater detail.

FIG. 2 shows the phase comparator of FIG. 1 in greater detail. The phase comparator 3a in FIG. 2 comprises a first flip-flop 15 and a second flip-flop 16. In the present example, the flip-flops are D flip-flops. The first input 2 of the phase comparator 3a is coupled to a first input 17 of the flip-flop 15, which is the D input of the flip-flop. An output 21 of the flip-flop 15 is coupled to a first input 22 of the second flip-flop 16, i.e., the D input of this flip-flop. The second input 4 of the phase comparator 3a is coupled to a second input 18 of the first flip-flop and, via an inverting element 20, to a second input 19 of the second flip-flop. These second inputs of the flip-flops are the clock inputs of the two flip-flops. The output 21 of the flip-flop 15 and an output 23 of the flip-flop 16 are coupled to inputs of a first gate circuit 24, in the present example an exclusive-OR circuit. The first input 17 and the output 21 of the flip-flop 15 are coupled to inputs of a second gate circuit 25, in the present example, an exclusive-OR circuit. The output of the gate 25 is coupled to a first output 5.1 of the phase comparator 3a. The output of the gate 24 is coupled to a second output 5.2 of the phase comparator 3a. The output 5 in FIG. 1 thus comprises two sub-outputs 5.1 and 5.2 coupled to corresponding sub-inputs 6.1 and 6.2 (not shown) of the generator unit 7.

FIGS. 3a–3f illustrate the operation of the phase comparator shown in FIG. 2. FIG. 3a shows the binary input signal, which is applied to the input terminal 1, as a function of time. The signal has a rising edge followed by a falling edge. FIG. 3b shows the clock signal applied to the input 4 of the phase comparator 3a. The period of the clock signal is T and the duty cycle of the clock signal is 50%. The period T complies with the relationship $T=1/f_o$, where $f_o$ is the clock frequency of the clock signal supplied by the oscillator 10. FIG. 3c shows the output signal $Q_1$ at the output 21 of the flip-flop 15. As a result of these signals the signal UP appears, see FIG. 3d, at the output 5.1. FIG. 3e shows the output signal $Q_2$ at the output 23 of the flip-flop 16. As a result, the signal DOWN, see FIG. 3f, appears at the output 5.2. The rising edge in the signal in FIG. 3a results in a first pulse, the pulse $P_1$, in the UP signal and a second pulse, the pulse $P_2$, in the DOWN signal. The falling edge in the signal in FIG. 3a results in a third pulse, the pulse $P_3$, in the UP signal and a fourth pulse, the pulse $P_4$, in the DOWN signal. In the present example, the spacing between the edges in the binary signal in FIG. 3a is equal to T.

The situation in FIGS. 3a–3f is the situation in which the phase difference is 0. In the present example, this means that the rising edge $E_u$ in the signal in FIG. 3b appears a time interval equal to T/2 after the rising edge in the binary signal in FIG. 3a. This rising edge $E_u$ can be used for recovering the digital signal. In the example of FIGS. 3a–3f it appears that the four pulses $P_1$ to $P_4$ all have the same width, i.e., T/2.

What has been said in the preceding paragraph about the rising edge in the signal in FIG. 3a also applies to the falling edge in this signal. Moreover, it is to be noted that the width of the pulses $P_2$ and $P_4$ is T/2 in the present example but that this is not strictly necessary. The width of the pulses may deviate from the value T/2, provided that the pulse width is proportional to 1 divided by the oscillation frequency $f_o$. Thus, the width could be, for example, T/3 or 2T/3. In that case the rising edge $E_u$ will appear a time interval equal to T/3 (or 2T/3) after the rising edge in the binary signal in FIG. 3a. Pulse widths of T/4, 5T/16, 3T/8, 7T/16, 9T/16, 5T/8, 11T/16 or 3T/4 could also be considered. However, the width of the pulses $P_2$ and $P_4$ should not be too small or too large, i.e., not too close to T, since the this would result in asymmetric control.

The control-signal generator unit 7 is adapted to derive from the pulses $P_1$ to $P_4$, a control signal which is applied to the voltage-controlled oscillator. In an example of the generator unit 7, the pulses P1 to P4 are integrated, the pulses $P_2$ and $P_4$ first being given a negative sign. In the case of FIGS. 3a–3f, this results in a control signal change equal to 0, so that the frequency of the oscillation signal does not change.

It is to be noted here that the generator unit 7 can already derive a control signal and apply this to the oscillator 10 on the basis of the integrated values of the pulses $P_1$ and $P_2$, after a rising edge has appeared in the binary signal. Likewise, the control-signal generator unit can derive a control signal and apply this to the oscillator 10 on the basis of the integrated values of the pulses $P_3$ and $P_4$, after a falling edge has appeared in the binary signal.

FIGS. 4a–4f represent a situation in which there is a positive phase difference dφ between the binary signal and the oscillation signal. This is visible in the signal in FIG. 4b in that the rising edge $E_u$ in the oscillation signal appears later than the instant $t_h$, which occurs a time interval T/2 after the rising edge in the binary signal in FIG. 4a. It is now essential that the pulses $P_2$ and $P_4$ still have a width equal to T/2, whereas the pulses $P_1$ and $P_3$ are wider by an amount equal to the phase difference dφ. The integration of the pulses $P_1$ and $P_2$ as stated above (and likewise the integration of the pulses $P_1$ and $P_3$ and the integration of the pulses $P_2$ and $P_4$) yields a positive change in value at the output 8 of the generator unit 7. The oscillation frequency will increase in response to this, as a result of which the rising edge $E_u$ will move to the left in the signal in FIG. 4b until the phase difference dφ is substantially zero.

FIGS. 5a–5f illustrate a situation in which there is a negative phase difference dφ between the binary signal and the oscillation signal. This is visible in the signal in FIG. 5b in that the rising edge $E_u$ in the oscillation signal appears earlier than the instant $t_h$, which occurs a time interval T/2 after the rising edge in the binary signal in FIG. 5a. It is again essential that the pulses $P_2$ and $P_4$ still have a width equal to T/2, whereas the pulses $P_1$ and $P_3$ are narrower by an amount equal to the phase difference dφ. The integration of the pulses $P_1$ and $P_2$ as stated above (and likewise the integration of the pulses $P_1$ and $P_3$ and the integration of the pulses $P_2$ and $P_4$) now yields a negative change in value at the output 8 of the generator unit 7. The oscillation frequency will decrease in response to this, as a result of which the rising edge $E_u$ will move to the right in the signal in FIG. 5b until the phase difference dφ is substantially zero.

It is obvious that the width of the pulses $P_2$ and $P_4$ also varies in the case of a varying oscillator frequency $f_o$.

Timing errors in the circuit arrangement shown in FIG. 2 can be precluded by matching the inherent delay of the inverter 20 to that of the flip-flops 15 and 16. Another possibility is to provide an additional delay in the connection from the terminal 2 to the input of the gate circuit 25, this delay should then be substantially equal to the propagation delay from the CK input 18 to the Q output 21 of the flip-flop 15.

FIG. 6 shows a second embodiment of the phase comparator. The phase comparator 3b in FIG. 6 bears much resemblance to the phase comparator 3a in FIG. 2. The inverting element 20 in FIG. 2 is absent in FIG. 6. Moreover, there is provided a third gate circuit 30, in the form of an AND gate. The AND gate 30 has one input coupled to the input 4 of the phase comparator and its other input to the output of the gate 24. The output of the AND gate 30 is now coupled to the second output 5.2.

Figure 7:
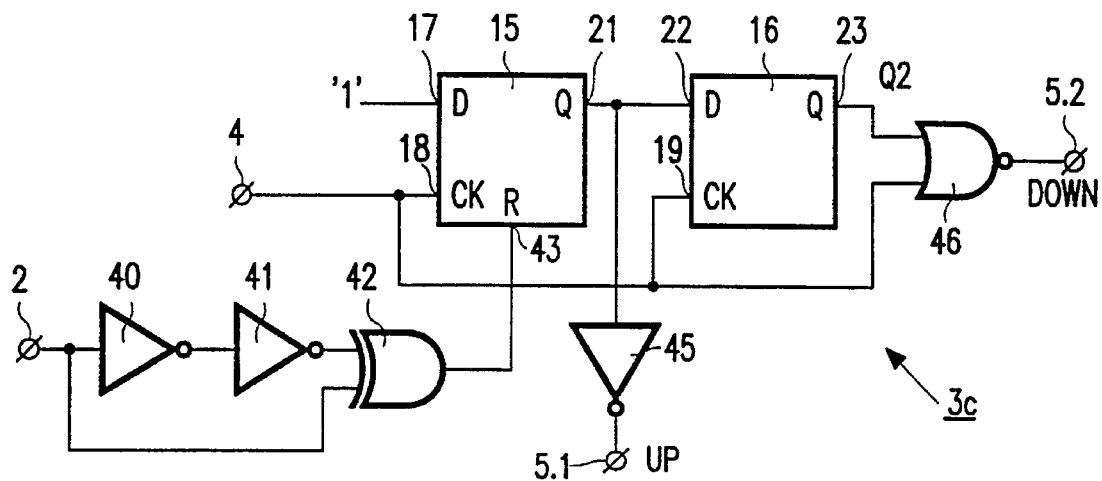
FIG. 7 shows a third embodiment of the phase comparator.

FIG. 7 shows a third embodiment of the phase comparator. The phase comparator 3c again comprises a first flip-flop 15 and a second flip-flop 16. The first input 2 of the phase comparator 3c is now coupled to the reset input 43 of the flip-flop 15 via a series arrangement of two inverting elements 40 and 41 and an exclusive-OR gate 42. The inverting elements 40 and 41 operate as a delay unit and in conjunction with the exclusive-OR gate 42 they are intended to serve as edge detector for the VCO signal.

The output 21 of the flip-flop 15 is again coupled to the first input 22 of the second flip-flop 16, which is the D input of this flip-flop. The second input 4 of the phase comparator 3c is again coupled to the clock input 18 of the first flip-flop and to the clock input 19 of the second flip-flop. The output 21 of the flip-flop 15 is coupled to the first output 5.1 of the phase comparator 3c via an inverting element 45. The output 23 of the flip-flop 16 and the input 4 are coupled to inputs of a gate circuit 46, in the present example, a NOR circuit. The output of the gate 46 is coupled to the second output 5.2 of the phase comparator 3c. A logic "1" is applied to the input 17 of the flip-flop 15.

Figure 8:
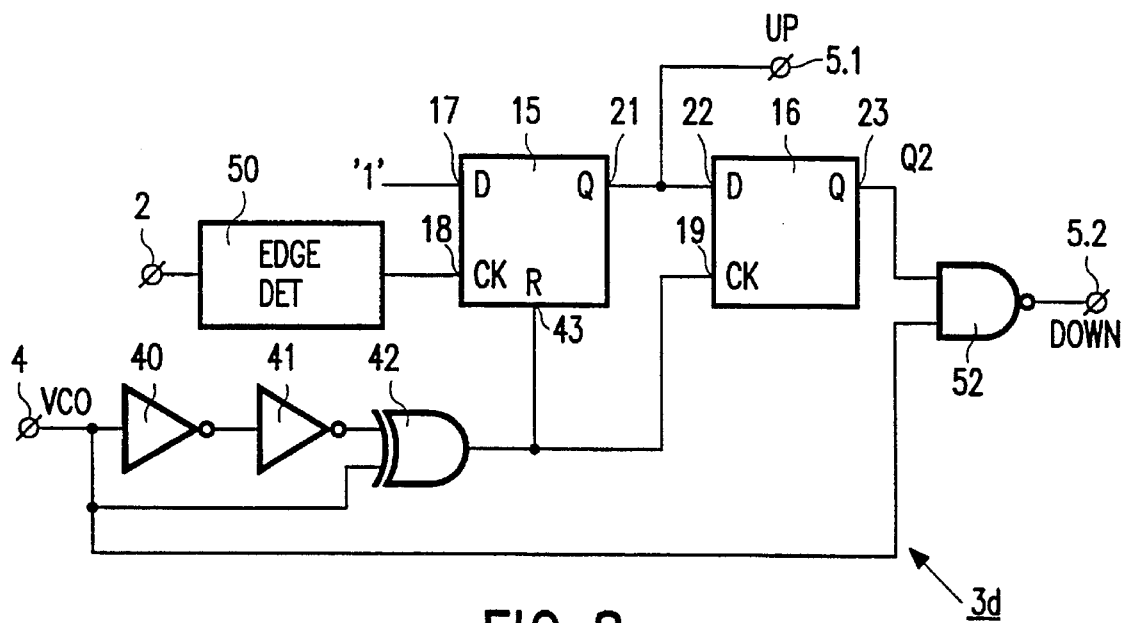
FIG. 8 shows a fourth embodiment of the phase comparator.

FIG. 8 shows yet another embodiment of the phase comparator. The phase comparator 3d in FIG. 8 again comprises a first flip-flop 15 and a second flip-flop 16. The first input 2 of the phase comparator 3d is now coupled to the clock input 18 of the flip-flop 15 via an edge detection circuit 50. The output 21 of the flip-flop 15 is again coupled to the first input 22 of the second flip-flop 16, which is the D input of this flip-flop. The second input 4 of the phase comparator 3d is now coupled to the reset input 43 of the first flip-flop via the series arrangement of two inverting elements 40 and 41 and an exclusive-OR gate 42 and to the clock input 19 of the second flip-flop 16. The output 21 of the flip-flop 15 is coupled to the first output 5.1 of the phase comparator 3c to supply the UP signal. The output 23 of the flip-flop 16 and the input 4 are coupled to inputs of a gate circuit 52, in the present example a NAND circuit. The output of the gate 52 is coupled to the second output 5.2 of the phase comparator 3d. Again, a logic "1" is applied to the input 17 of the flip-flop 15.

Figure 9:
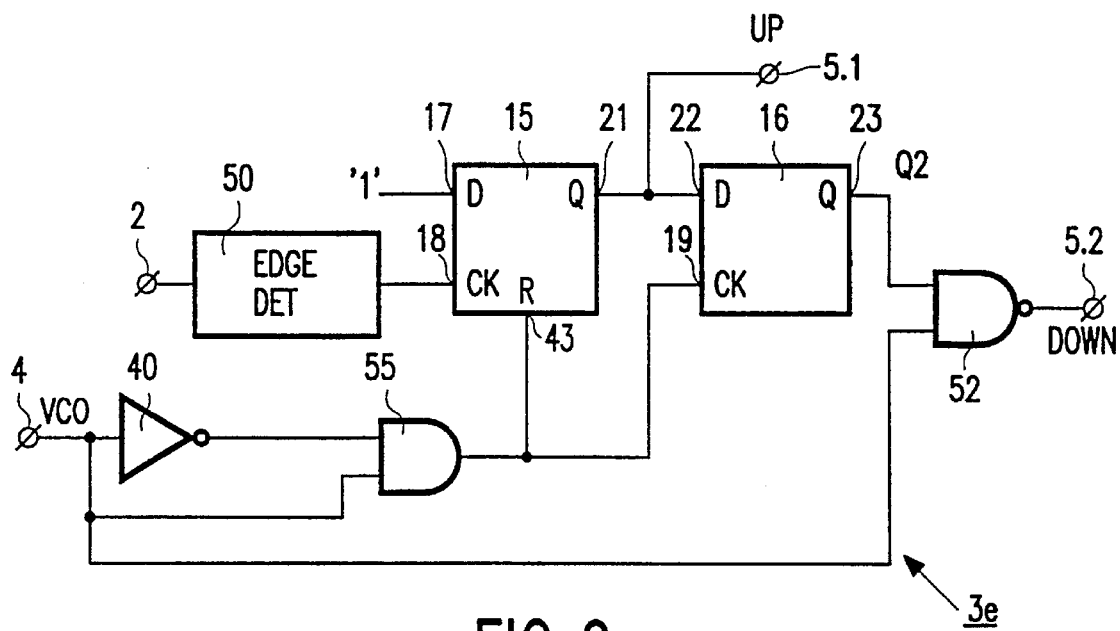
FIG. 9 shows a fifth embodiment of the phase comparator.

FIG. 9 shows still another embodiment of the phase comparator. The phase comparator 3e in FIG. 9 again comprises a first flip-flop 15 and a second flip-flop 16. The first input 2 of the phase comparator 3e is again coupled to the clock input 18 of the flip-flop 15 via an edge detection circuit 50. The edge detection circuit supplies a pulse of a given width upon detection of a rising or a falling edge in the binary input signal. The output 21 of the flip-flop 15 is again coupled to the D input 22 of the second flip-flop 16. The second input 4 of the phase comparator 3e is now coupled to the reset input 43 of the first flip-flop via a series arrangement of an inverting element 40 and an AND gate 55, and to the clock input 19 of the second flip-flop 16. The output 21 of the flip-flop 15 is again coupled to the first output 5.1 of the phase comparator 3e to supply the UP signal. The output 23 of the flip-flop 16 and the input 4 are coupled to inputs of a gate circuit 52, in the present example again a NAND circuit. The output of the gate 52 is coupled to the second output 5.2 of the phase comparator 3e. Again, a logic "1" is applied to the input 17 of the flip-flop 15. The elements 40 and 55 again operate as an edge detector, in the present case for the rising edges in the VCO signal.

Figure 10:
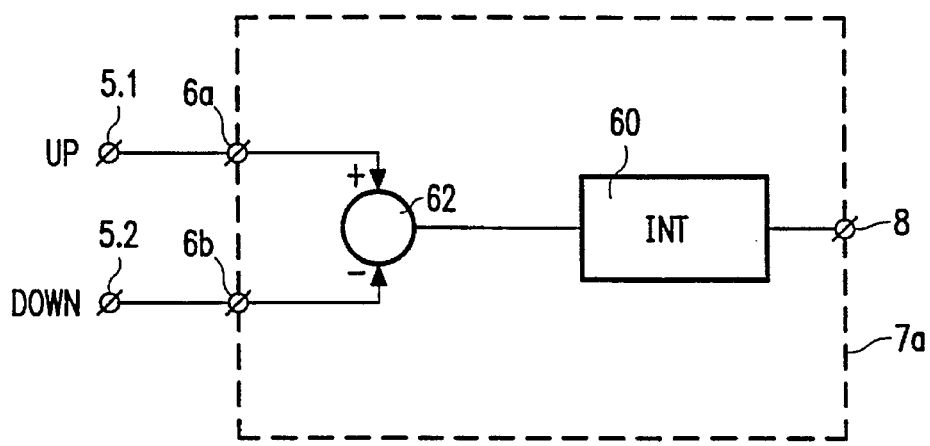
FIG. 10 shows an example of the control-signal generator unit.

FIG. 10 shows an example of the signal generator unit 7. The generator unit, referenced 7a in the present example, comprises a signal combining unit 62, in the form of a subtracter circuit, having a first and a second input coupled to the first input 6.a and the second input 6.b, respectively, and an integrating element 60, coupled between the output of the combining unit 62 and the output 8. It is obvious that the signal combining unit 62 may form part of the phase comparator. In that case the phase comparator has only one output 5 instead of two sub-outputs 5.1 and 5.2.

Figure 11:
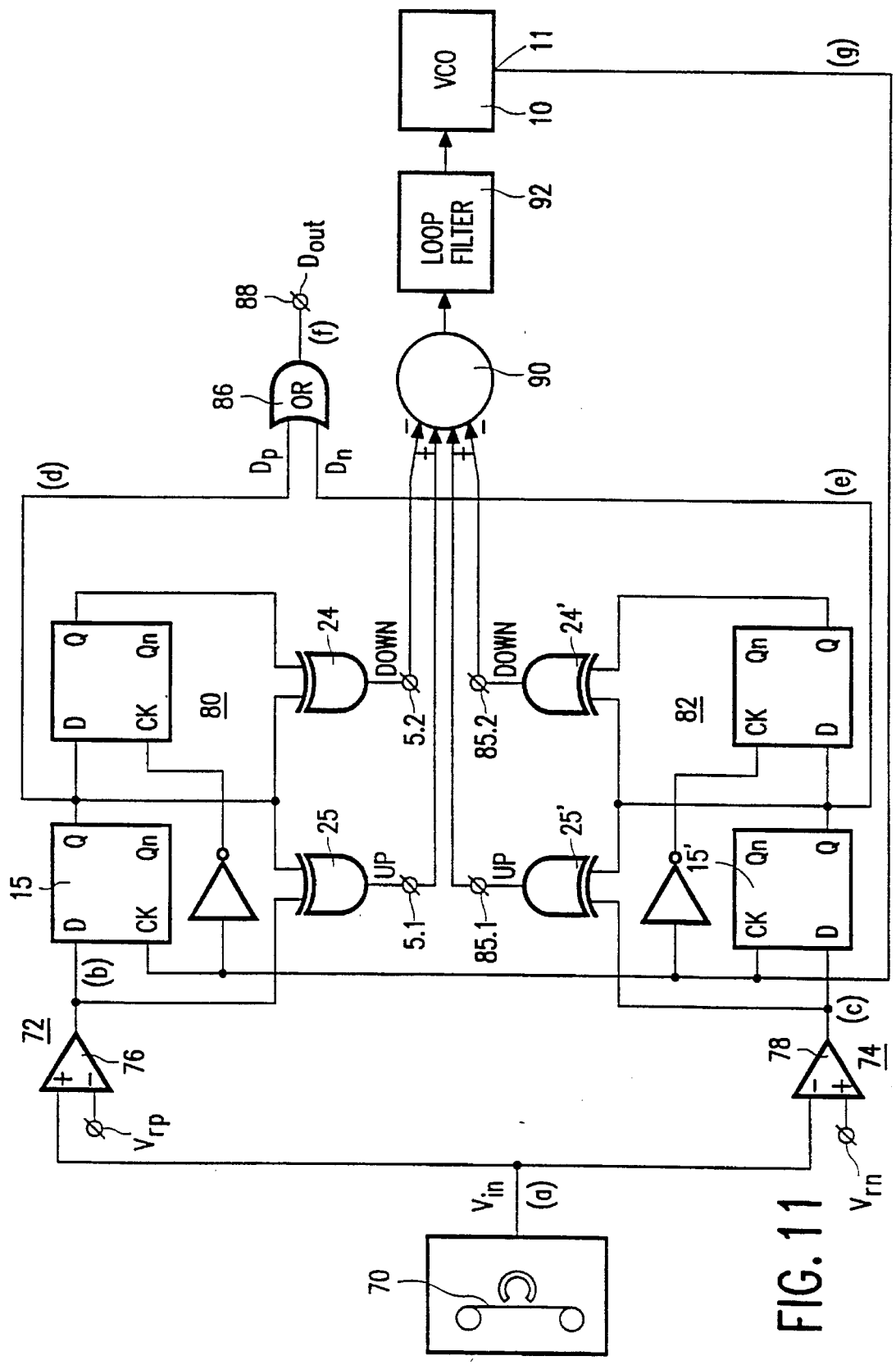
FIG. 11 shows an example of a data detector including the phase comparator shown in FIG. 2.

FIG. 11 shows an example of a data detector for the detection of bits in a signal which has been read from a record carrier 70. The data detector is a detector of the PR IV type, i.e., partial response class 4, or of the Nyquist 1 type. The detector has two branches 72 and 74. The branch 72 is intended for the detection of positive pulses and the branch 74 is intended for the detection of negative pulses in the signal $Vh_{in}$ read from the record carrier 70. The signal $V_{in}$ is applied to threshold comparators 76 and 78 in the two branches. The output of the threshold comparator 76 is coupled to an input of a phase comparator 80 as shown in FIG. 2. The output of the threshold comparator 78 is coupled to an input of a phase comparator 82 as shown in FIG. 2. The Q outputs of the flip-flops 15 and 15' in the phase comparators 80 and 82, respectively, are coupled to inputs of an OR gate 86, which has an output coupled to an output terminal 88. The outputs 5.1 and 5.2 of the gate circuits 24 and 25 of the phase comparator 80 and the outputs 85.1 and 85.2 of the gate circuits 24' and 25' of the phase comparator 82 are coupled to inputs of a signal combination unit 90, which has an output coupled to an input of a loop filter 92, which forms part of the unit 7 in FIG. 1.

Figure 12A:
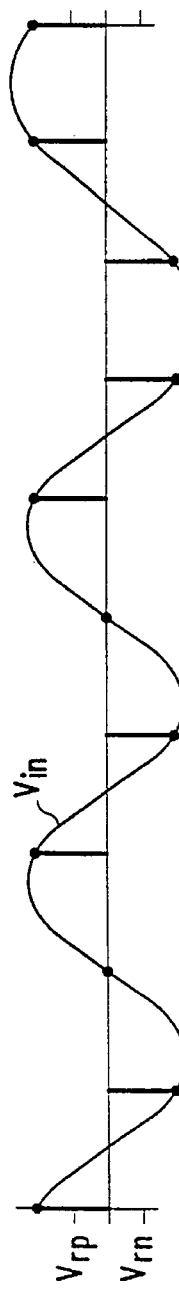
FIGS. 12a–12g show some signal waveforms appearing in the data detector shown in FIG. 11.
Figure 12B:
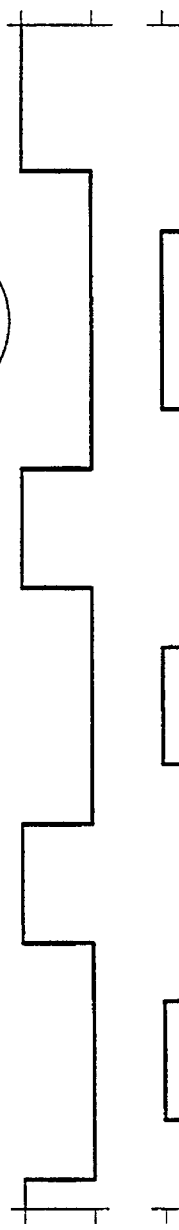
Figure 12C:
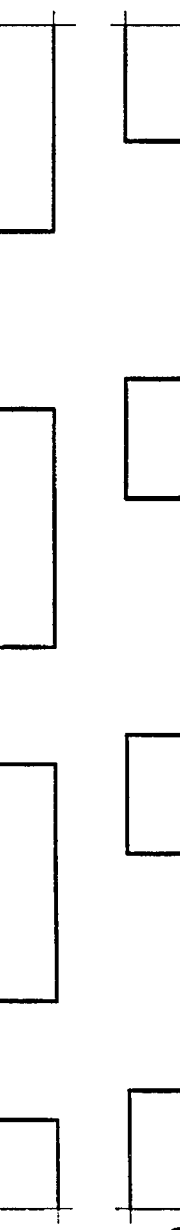
Figure 12D:
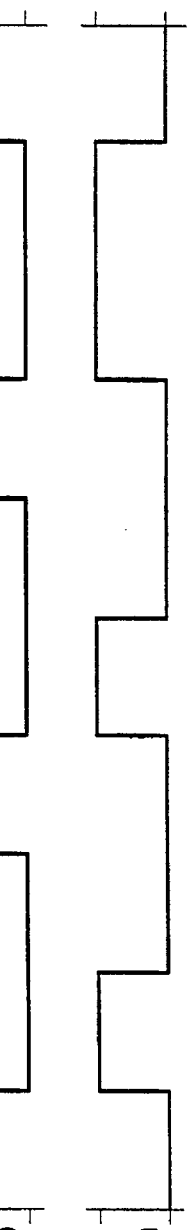
Figure 12E:
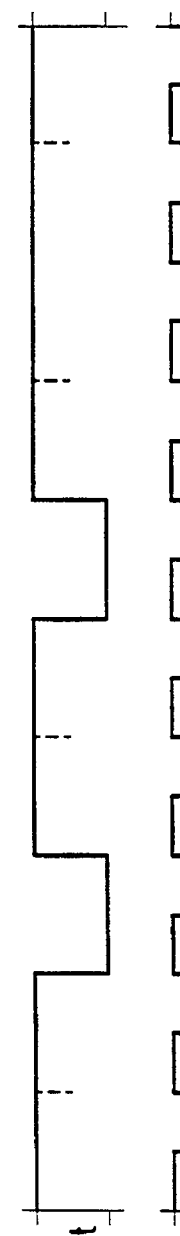
Figure 12F:
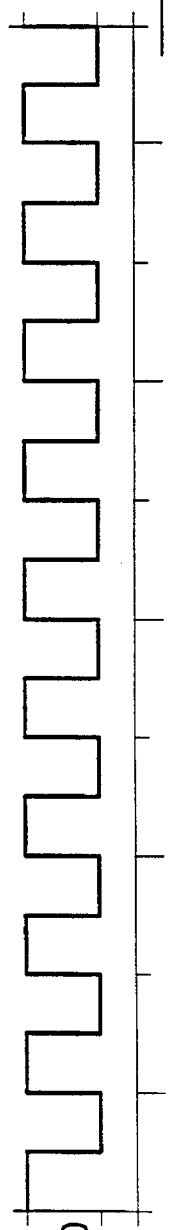
Figure 12G:
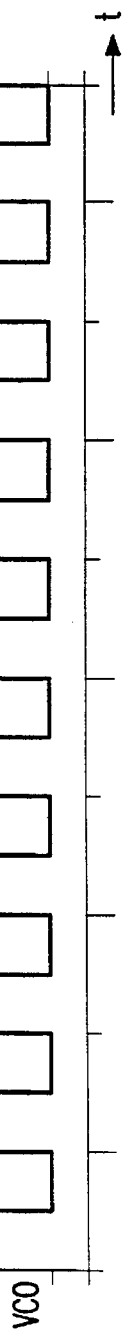

The signal $V_{in}$ is shown in FIG. 12a. Comparison of the signal $V_{in}$ with the thresholds $V_{rp}$ and $V_{rn}$ results in signals as shown in FIGS. 12b and 12c, respectively, appearing at the outputs of the threshold comparators 76 and 78, respectively. At the Q outputs of the flip-flops 15 and 15' signals $D_p$ and $D_n$ appear, which are shown in FIGS. 12d and 12e. The actual data signal $D_{out}$ as shown in FIG. 12f appears at the output of the OR gate 86. The output signal of the oscillator 10 is shown in FIG. 12g. The rising edges in this signal are the clock instants at which the signal $V_{in}$ in FIG. 12a is sampled. The detection is such that if at a clock instant $V_{in}$ has a value larger than $V_{rp}$ or larger than $V_{rn}$ (in the negative direction) it is determined that the transmitted bit is a "1" bit or otherwise a "0". This results in the signal $D_{out}$ in FIG. 12f.

We claim:

1. A phase-locked loop comprising:

an input terminal for receiving a binary signal;

a phase comparator having a first input coupled to the input terminal, a second input, and output means; and a control-signal-controlled oscillator having an input for receiving a control signal, said input being coupled to the output means of the phase comparator, and an output for supplying an oscillation signal of a given frequency in response to the control signal, said output being coupled to the second input of the phase comparator, characterized in that the phase comparator is adapted to derive a first pulse and a second pulse in response to a signal transition from a first value to a second value in the binary signal applied to the first input and the oscillation signal applied to the second input, said first pulse having a pulse width which is a measure of a phase difference between the binary signal and the oscillation signal, and said second pulse having a pulse width proportional to ½ $f_o$, where $f_o$ is said given frequency of the oscillation signal, the phase-locked loop further comprising a control-signal generator unit coupled to the output means of said phase comparator, said control-signal generator unit deriving said control signal from the first pulse and the second pulse, and applying said control signal to an output, said output being coupled to the input of the oscillator, whereby the control-signal generator unit derives the control signal from the first and the second pulse such that the phase difference between said binary signal and said oscillation signal is controlled substantially toward zero, the phase comparator comprising a first flip-flop and a second flip-flop, each of said first and second flip-flops having a first input, a second input and an output, the first input and the second input of the phase comparator being coupled to the first input and the second input, respectively, of the first flip-flop, the output of the first flip-flop being coupled to both the first input of the second flip-flop and the first output of the phase comparator, the second input of the phase comparator also being coupled to the second input of the second flip-flop, and the output of the second flip-flop being coupled to the second output of the phase comparator, the phase comparator further comprising a first gate circuit having a first input and a second input coupled to the outputs of the first and the second flip-flop, respectively, and having an output coupled to the second output of the phase comparator, a second gate circuit having a first input and a second input coupled to the first input and the output, respectively, of the first flip-flop, and having an output coupled to the first output of the phase comparator, and a third gate circuit having a first input and a second input coupled to the second input of the phase comparator and the output of the first gate circuit, respectively, and having an output coupled to the second output of the phase comparator.

2. A phase-locked loop as claimed in claim 1, characterized in that the phase comparator is further adapted to derive a third pulse and a fourth pulse in response to a subsequent signal transition from the second value to the first value in the binary signal applied to the first input and the oscillation signal applied to the second input, said third pulse having a pulse width which is a measure of the phase difference between the binary signal and the oscillation signal, and said fourth pulse having a pulse width proportional to ½ $f_0$, the control-signal generator unit being further adapted to derive from the first, the second, the third and the fourth pulses, the control signal and to supply the control signal to the output, and the control-signal generator unit deriving said control signal such that the phase difference is controlled substantially toward zero.

3. A phase-locked loop as claimed in claim 2, characterized in that the output means of the phase comparator comprises a first output and a second output, said phase comparator supplying the first pulse and the third pulse to said first output and the second pulse and the fourth pulse to said second output, and the control-signal generator unit has a first input and a second input coupled to the first output and the second output, respectively, of the phase comparator.

4. A phase-locked loop as claimed in claim 1, characterized in that the first and second flip-flops are D flip-flops, the first inputs of the first and second flip-flops are the D inputs, and the second inputs of the first and second flip-flops are the clock inputs.

5. A phase-locked loop as claimed in claim 4, characterized in that the first gate circuit and the second gate circuit are both exclusive-OR gates.

6. A phase-locked loop as claimed in claim 5, characterized in that the third gate circuit is an AND gate.

7. A phase-locked loop as claimed in claim 1, characterized in that the pulse width of the second pulse is substantially equal to ½ $f_0$.

8. A phase-locked loop as claimed in claim 1, characterized in that the flip-flops are D flip-flops.

9. A phase-locked loop comprising:

an input terminal for receiving a binary signal;

a phase comparator having a first input coupled to the input terminal, a second input, and output means; and a control-signal-controlled oscillator having an input for receiving a control signal, said input being coupled to the output means of the phase comparator, and an output for supplying an oscillation signal of a given frequency in response to the control signal, said output being coupled to the second input of the phase comparator, characterized in that the phase comparator is adapted to derive a first pulse and a second pulse in response to a signal transition from a first value to a second value in the binary signal applied to the first input and the oscillation signal applied to the second input, said first pulse having a pulse width which is a measure of a phase difference between the binary signal and the oscillation signal, and said second pulse having a pulse width proportional to ½ $f_0$, where $f_o$ is said given frequency of the oscillation signal, the phase-locked loop further comprising a control-signal generator unit coupled to the output means of said phase comparator, said control-signal generator unit deriving said control signal from the first pulse and the second pulse, and applying said control signal to an output, said output being coupled to the input of the oscillator, whereby the control-signal generator unit derives the control signal from the first and the second pulse such that the phase difference between said binary signal and said oscillation signal is controlled substantially toward zero, wherein the phase comparator comprises a first flip-flop and a second flip-flop, each of said first and second flip-flops having a first input, a second input and an output, the first input and the second input of the phase comparator being coupled to the first input and the second input, respectively, of the first flip-flop, the output of the first flip-flop being coupled to both the first input of the second flip-flop and the first output of the phase comparator, the second input of the phase comparator also being coupled to the second input of the second flip-flop, and the output of the second flip-flop being coupled to the second output of the phase comparator, the phase comparator further comprising a first gate circuit having a first input and a second input coupled to the second input of the phase comparator and the output of the second flip-flop, respectively, and having an output coupled to the second output of the phase comparator.

10. A phase-locked loop as claimed in claim 9, characterized in that the second input of the phase comparator is coupled to the second inputs of the first and the second flip-flop via a second gate circuit.

11. A phase-locked loop as claimed in claim 10, characterized in that the flip-flops are D flip-flops, and in that the first input of the first flip-flop and the second input of the second flip-flop are clock inputs, the second input of the first flip-flop is the reset input and the first input of the second flip-flop is the D input.

12. A phase-locked loop as claimed in claim 9, characterized in that the first input of the phase comparator is coupled to the first input of the first flip-flop via a second gate circuit.

13. A phase-locked loop as claimed in claim 12, characterized in that the first and second flip-flops are D flip-flops, and in that the first input of the first flip-flop is a reset input, the second inputs of the first flip-flop and the second flip-flop are clock inputs, and the first input of the second flip-flop is a D input.

14. A phase-locked loop as claimed in claim 13, characterized in that the first gate circuit is a NOR gate and the second gate circuit is an exclusive-OR gate.

15. A phase-locked loop as claimed in claim 9, characterized in that the first and second flip-flops are D flip-flops.

16. A phase-locked loop as claimed in claim 9, characterized in that the first and second flip-flops are D flip-flops, and in that the first input of the first flip-flop and the second input of the second flip-flop are clock inputs, the second input of the first flip-flop is a reset input and the first input of the second flip-flop is a D input.

17. A phase-locked loop as claimed in claim 16, characterized in that the first gate circuit is a NAND gate.

18. A phase-locked loop as claimed in claim 9, characterized in that the phase comparator is further adapted to derive a third pulse and a fourth pulse in response to a subsequent signal transition from the second value to the first value in the binary signal applied to the first input and the oscillation signal applied to the second input, said third pulse having a pulse width which is a measure of the phase difference between the binary signal and the oscillation signal, and said fourth pulse having a pulse width proportional to ½ $f_0$, the control-signal generator unit being further adapted to derive from the first, the second, the third and the fourth pulses, the control signal and to supply the control signal to the output, and the control-signal generator unit deriving said control signal such that the phase difference is controlled substantially toward zero.

19. A phase-locked loop as claimed in claim 18, characterized in that the output means of the phase comparator comprises a first output and a second output, said phase comparator supplying the first pulse and the third pulse to said first output and the second pulse and the fourth pulse to said second output, and the control-signal generator unit has a first input and a second input coupled to the first output and the second output, respectively, of the phase comparator.

20. A phase comparator having a first input coupled to an input terminal, a second input, and output. means, characterized in that the phase comparator is adapted to derive a first pulse and a second pulse in response to a signal transition from a first value to a second value in a binary signal applied to the first input and an oscillation signal applied to the second input, said first pulse having a pulse width which is a measure of a phase difference between the binary signal and the oscillation signal, and said second pulse having a pulse width proportional to ½ $f_0$, where $f_o$ is a frequency of the oscillation signal, wherein the phase comparator comprises a first flip-flop and a second flip-flop, each of said first and second flip-flops having a first inputs, a second input and an output, the first input and the second input of the phase comparator being coupled to the first input and the second input respectively, of the first flip-flop, the output of the first flip-flop being coupled to both the first input of the second flip-flop and the first output of the phase comparator, the second input of the phase comparator also being coupled to the second input of the second flip-flop, and the output of the second flip-flop being coupled to the second output of the phase comparator, the phase comparator further comprising a first gate circuit having a first input and a second input coupled to the outputs of the first and the second flip-flop, respectively, and having an output coupled to the second output of the phase comparator, a second gate circuit having a first input and a second input coupled to the first input and the output, respectively, of the first flip-flop, and having an output coupled to the first output of the phase comparator, and a third gate circuit having a first input and a second input coupled to the second input of the phase comparator and the output of the first gate circuit, respectively, and having an output coupled to the second output of the phase comparator.

21. A phase comparator as claimed in claim 20, characterized in that the phase comparator is further adapted to derive a third pulse and a fourth pulse in response to a subsequent signal transition from the second value to the first value in the binary signal applied to the first input and the oscillation signal applied to the second input, said third pulse having a pulse width which is a measure of the phase difference between the binary signal and the oscillation signal, and said fourth pulse having a pulse width proportional to ½ $f_0$.

22. A reproducing device for reproducing binary signals read from a record carrier, said device comprising:

means for reading the binary signals from the record carrier; and a phase-locked loop, coupled to said means for reading the binary signal, for locking an oscillation signal onto the binary signal read from the record carrier, said phase-locked loop comprising:

an input terminal for receiving the binary signal;

a phase comparator having a first input coupled to the input terminal, a second input, and output means; and a control-signal-controlled oscillator having an input for receiving a control signal, said input being coupled to the output means of the phase comparator, and an output for supplying said oscillation signal of a given frequency in response to the control signal, said output being coupled to the second input of the phase comparator, characterized in that the phase comparator is adapted to derive a first pulse and a second pulse in response to a signal transition from a first value to a second value in the binary signal applied to the first input and the oscillation signal applied to the second input, said first pulse having a pulse width which is a measure of a phase difference between the binary signal and the oscillation signal, and said second pulse having a pulse width proportional to ½ $f_0$, where $f_o$ is said given frequency of the oscillation signal, the phase-locked loop further comprising a control-signal generator unit coupled to the output means of said phase comparator, said control-signal generator unit deriving said control signal from the first pulse and the second pulse, and applying said control signal to an output, said output being coupled to the input of the oscillator, whereby the control-signal generator unit derives the control signal from the first and the second pulse such that the phase difference between said binary signal and said oscillation signal is controlled substantially toward zero, the phase comparator comprising a first flip-flop and a second flip-flop, each of said first and second flip-flops having a first input, second input and an output, the first input and the second input of the phase comparator being coupled to the first input and the second input, respectively, of the first flip-flop, the output of the first flip-flop being coupled to both the first input of the second flip-flop and the first output of the phase comparator, the second input of the phase comparator also being coupled to the second input of the second flip-flop, and the output of the second flip-flop being coupled to the second output of the phase comparator, the phase comparator further comprising a first gate circuit having a first input and a second input coupled to the outputs of the first and the second flip-flop, respectively, and having an output coupled to the second output of the phase comparator, a second gate circuit having a first input and a second input coupled to the first input and the output, respectively, of the first flip-flop, and having an output coupled to the first output of the phase comparator, and a third gate circuit having a first input and a second input coupled to the second input of the phase comparator and the output of the first gate circuit, respectively, and having an output coupled to the second output of the phase comparator.

23. A phase comparator having a first input coupled to an input terminal, a second input, and output means, characterized in that the phase comparator is adapted to derive a first pulse and a second pulse in response to a signal transition from a first value to a second value in a binary signal applied to the first input and an oscillation signal applied to the second input, said first pulse having a pulse width which is a measure of a phase difference between the binary signal and the oscillation signal, and said second pulse having a pulse width proportional to ½ $f_0$, where $f_o$ is a frequency of the oscillation signal, wherein the phase comparator comprises a first flip-flop and a second flip-flop, each of said first and second flip-flops having a first input, a second input and an output, the first input and the second input of the phase comparator being coupled to the first input and the second input, respectively, of the first flip-flop, the output of the first flip-flop being coupled to both the first input of the second flip-flop and the first output of the phase comparator, the second input of the phase comparator also being coupled to the second input of the second flip-flop, and the output of the second flip-flop being coupled to the second output of the phase comparator, the phase comparator further comprising a first gate circuit having a first input and a second input coupled to the second input of the phase comparator and the output of the second flip-flop, respectively, and having an output coupled to the second output of the phase comparator.

24. A reproducing device for reproducing binary signals read from a record carrier, said device comprising:

means for reading the binary signals from the record carrier; and a phase-locked loop, coupled to said means for reading the binary signal, for locking an oscillation signal onto the binary signal read from the record carrier, said phase-locked loop comprising:

an input terminal for receiving the binary signal;

a phase comparator having a first input coupled to the input terminal, a second input, and output means; and a control-signal-controlled oscillator having an input for receiving a control signal, said input being coupled to the output means of the phase comparator, and an output for supplying said oscillation signal of a given frequency in response to the control signal, said output being coupled to the second input of the phase comparator, characterized in that the phase comparator is adapted to derive a first pulse and a second pulse in response to a signal transition from a first value to a second value in the binary signal applied to the first input and the oscillation signal applied to the second input, said first pulse having a pulse width which is a measure of a phase difference between the binary signal and the oscillation signal, and said second pulse having a pulse width proportional to ½ $f_o$, where $f_o$ is said given frequency of the oscillation signal, the phase-locked loop further comprising a control-signal generator unit coupled to the output means of said phase comparator, said control signal generator unit deriving said control signal from the first pulse and the second pulse, and applying said control signal to an output, said output being coupled to the input of the oscillator, whereby the control-signal generator unit derives the control signal from the first and the second pulse such that the phase difference between said binary signal and said oscillation signal is controlled substantially toward zero, the phase comparator comprising a first flip-flop and a second flip-flop, each of said first and second flip-flops having a first input, a second input and an output, the first input and the second input of the phase comparator being coupled to the first input and the second input, respectively, of the first flip-flop, the output of the first flip-flop being coupled to both the first input of the second flip-flop and the first output of the phase comparator, the second input of the phase comparator also being coupled to the second input of the second flip-flop, and the output of the second flip-flop being coupled to the second output of the phase comparator, the phase comparator further comprising a first gate circuit having a first input and a second input coupled to the second input of the phase comparator and the output of the second flip-flop, respectively, and having an output coupled to-the second output of the phase comparator.

\* \* \* \* \*